March 29, 1960 E. J. SLOBODZINSKI 2,930,907
TRANSISTOR BISTABLE CIRCUIT
Filed Dec. 23, 1957
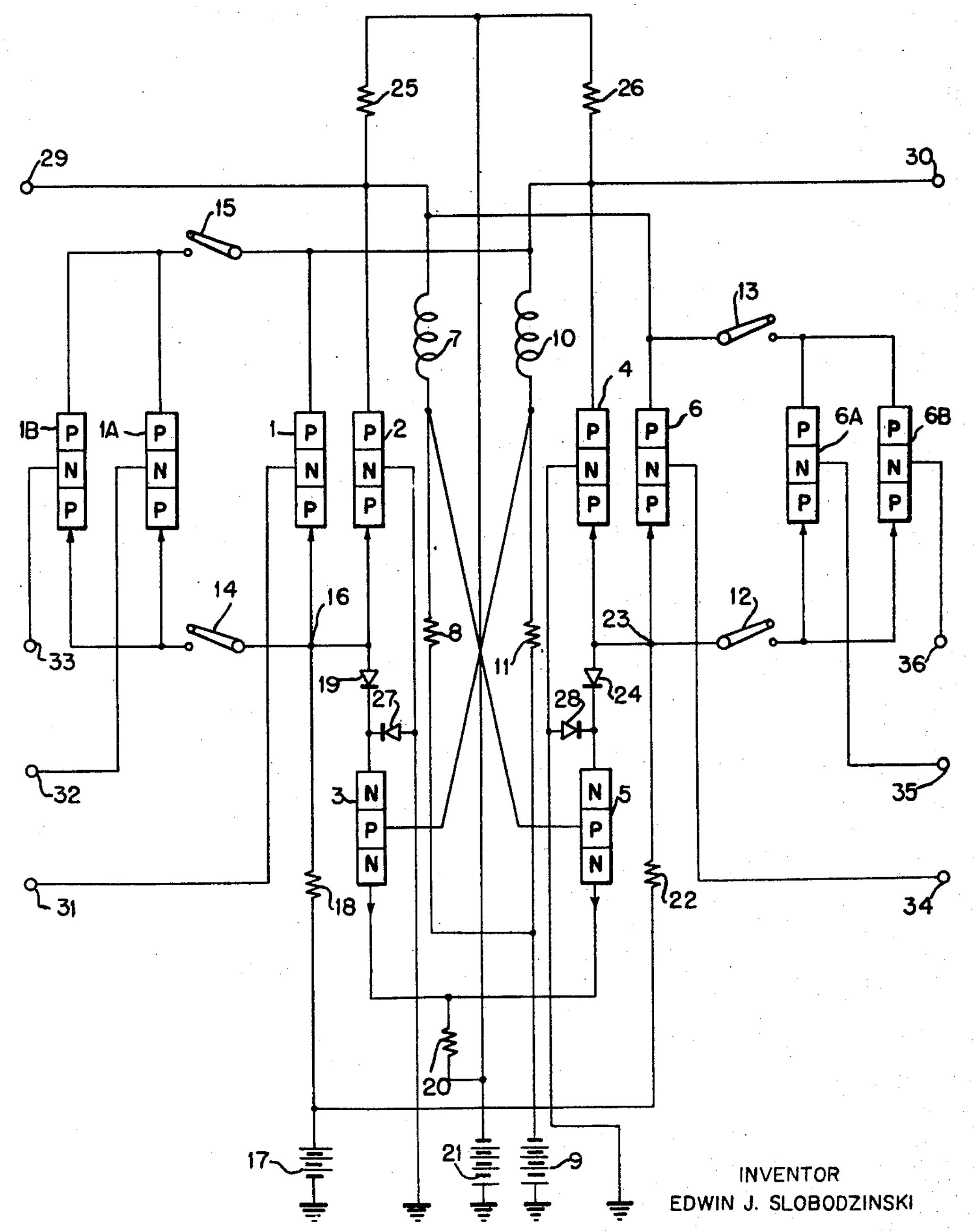
INVENTOR
EDWIN J. SLOBODZINSKI
BY
Alvin J. Riddles
ATTORNEY 2,930,907
Patented Mar. 29, 1960

1

2,930,907

TRANSISTOR BISTABLE CIRCUIT

Edwin J. Slobodzinski, Hopewell Junction, N.Y., assignor to International Business Machines Corporation, New York, N.Y., a corporation of New York Application December 23, 1957, Serial No. 704,743

10 Claims. (Cl. 307—88.5)

This invention relates to bistable circuits and in particular to transistor bistable circuits wherein the circuit design is accomplished in such a manner as to take into consideration the limitations of the transistors used therein.

In the design and development of transistor circuitry for high-speed computer circuit design, a number of problems associated with the characteristics of the transistors used as the active elements in the circuit have been encountered. In order to minimize some of the effects encountered in circuit design wherein the limitations of the transistor become an important consideration, a technique of circuitry involving current switching from one path to another has been developed. This technique is described in the following reference: "High-Speed Transistor Computer Circuit Design," by R. A. Henle, in the Proceedings of the Eastern Joint Computer Conference, New York, pages 64 to 66.

In using this type of circuitry, it has been discovered that to achieve a megacycle frequency range of operation, it is necessary to employ very high-speed transistors. One type of high-speed transistor suitable for this type of circuitry is the "drift" type known in the art. The "high-speed" transistors have certain limitations in their operation that affect the circuitry into which they are inserted. Two of the more pronounced of these limitations are, a high collector saturation resistance and a low reverse emitter breakdown voltage. This invention is directed to the advantageous use of high-speed transistors in a megacycle frequency range transistor bistable circuit wherein certain of the limitations of the transistors are compensated for by the circuit design and other of these limitations are used to advantage to provide response in the circuit and to eliminate components in order to achieve desired effects.

An object of this invention is to provide a high-speed transistor bistable circuit.

Another object of this invention is to provide a high-speed transistor bistable circuit wherein a limitation of the transistor is compensated for in the circuit.

Still another object of this invention is to provide a high-speed transistor bistable circuit wherein the limitations of the transistor are used in the circuit to eliminate components.

Still another object of this invention is to provide an "N" input, pullover and latch type of cross-coupled transistor bistable circuit.

Other objects of the invention will be pointed out in the following description and claims and illustrated in the accompanying drawings, which disclose, by way of example, the principle of the invention and the best mode, which has been contemplated, of applying that principle.

In the drawings:

The figure is a transistor bistable circuit illustrating this invention.

Referring now to the figure, a transistor bistable circuit is shown. One of the primary advantages of this

2 bistable circuit is the short delay from the input to either output and the fact that during switching the input load specifications are maintained constant. The bistable circuit of the figure comprises transistors 1, 2, 3, 4, 5 and 6. Transistors 2 and 4 serve as switching elements for the bistable circuit operating in the grounded base type of circuit operation. Transistors 3 and 5 serve as latching elements, cross-coupled to the switching elements to hold the circuit in a particular stable state, and transistors 1 and 6 serve as pullover inverters cross-coupled to the load of the opposite side of the circuit for switching acceleration purposes. A load comprising a peaking inductor 7 and an impedance 8, in series, is connected between the output of transistor 2 and a power source 9. Similarly, a load, shown as a peaking coil 10 and impedance 11 in series, is connected between the collector of transistor 4 and the negative terminal of battery 9.

The pullover transistors 1 and 6 may be connected in parallel as by connecting switches 12 and 13 and 14 and 15 whereby a plurality, shown as transistors 1A, 1B, 6A and 6B, of pullover type transistor inputs may be provided on each of the two sides of the bistable circuit. When switches 12 and 13, 14 and 15 are closed these input transistors are in reality, what is known in the art as an "N" way "OR" circuit or in other words, an open-ended "OR" circuit whereinas many input terminals as are desired may be provided by merely connecting a greater number of transistors across two common lines. In the embodiment of the figure for illustration purposes, a total of three inputs are shown, these are labelled respectively 6, 6A, 6B and for the other side of the bistable circuit 1, 1A and 1B.

Considering the circuit in more detail, and referring specifically to the branch of the bistable circuit in which transistors 2 and 3 appear, a constant current is supplied to a point 16 from a power source 17 through a load impedance 18. The common point 16 supplies emitter current for one of transistors 1, 2, 1A and 1B as well as for the path through diode 19, opposite conductivity type transistor 3, resistor 20 and power source 21.

It will be apparent under these conditions that current supplied to point 16 will flow through the path that is the more heavily biased in the direction of easy current flow.

Similarly, from battery 17 through resistor 22, constant current is supplied to a point 23 on the other side of the bistable circuit which may serve as emitter current for transistors 4, 6, 6A, 6B or for the path through diode 24, opposite conductivity type transistor 5, resistor 20 and battery 21. Resistors 25 and 26 are each connected as an alternate load, respectively, between transistors 2 and 4 and battery 21 to provide the "Thevenin" equivalent of the loads previously recited as respectively comprising coil 10 and resistor 11 in series and coil 7 and resistor 28, in series. Diodes 27 and 28 are included to provide, under certain circuit conditions, to be later described, a collector current path to ground for transistors 3 and 5, respectively. The output of the portion of the bistable circuit involving transistor 2 is shown as terminal 29 and the output for the transistor 4 portion is shown as terminal 30. The input to transistor 1 is labelled terminal 31, transistor 1A is terminal 32 and transistor 1B is terminal 33. The input to transistor 6 is labelled 34 to transistor 6A is labelled 35 and to transistor 6B is labelled 36.

Since, as previously discussed, a constant current is supplied to points 16 and 23 of the circuit through a current generator comprising battery 17 and impedances 18 and 22, considering the side of the circuit involving point 16, current may now flow, either through transistor 2 or through transistor 3 depending upon which is more heavily biased in the direction of easy current flow. The "no signal" level at terminals 31, 32 and 33 is selected to establish transistors 1, 1A and 1B in the cut off condition. Similarly, considering point 23, current may now flow either through transistor 4 or transistor 5 depending on which is the more heavily biased for current flow, transistors 6, 6A and 6B being held off by the no signal level at terminals 34, 35 and 36. The input pullover transistors, during the time when the circuit is not actually in the process of switching, have their bases normally more positive than ground due to the fact that there is always a finite impedance in external circuitry. As a result of this, the bases of transistors 2 and 4, being connected directly to ground, are the more negative with respect to points 16 and 23, respectively, and therefore conduct the current supplied to these points unless the current is directed through either of the latching transistors 3 or 5.

For purposes of illustration, let us consider transistor 5 to be in the "On" or current flow condition wherein the current is supplied to point 23, flows through diode 24, transistor 5, impedance 20 and battery 21. Under these conditions, the collector current of transistor 5 is sufficient to leave no emitter current and hence to completely turn Off transistor 4. Since transistor 4 is "Off," the collector of transistor 4 is now more negative, under the transistor polarity shown in this illustration, than the return potential for the load branch comprising elements 10 and 11, since the value of impedance 26 is quite large and is returned to a larger potential source 21 than that of source 9. This potential level, greater than the level of battery 9, is coupled to the base of transistor 3 thereby holding it in the Off condition.

With no current flowing through transistor 3, the constant current applied to point 16 is now available as emitter current for transistor 2.

The current flowing through the collector of transistor 2 and through the branch of the load involving coil 7 through resistor 8 to battery 9 is such that the base of transistor 5 is maintained at a potential level that is higher than ground thereby holding transistor 5 in the "On" condition and stabilizing the circuit at this point.

Considering transistors 2 and 5 to be "On." In order to switch the trigger from one stable state to another, the base of one of the pullover transistors is caused to become more negative than the grounded base of transistor 2. This may be done to transistor 1 by applying a negative pulse to terminal 31 or if switches 13 and 14 are closed, a negative pulse may be applied to any one or all of terminals 31, 32 or 33. This results in the switching of the constant current supplied to point 16 from transistor 2 to transistor 1 since the negative pulse biases the base of the pullover transistor more negative than the ground level of the base to transistor 2. Transistor 2 goes "Off" immediately due to the lack of emitter current and the decrease of the collector current of transistor 2 permits the base of transistor 5 to proceed in the negative direction of battery 9 until the base of transistor 5 is more negative than the emitter, connected to battery 21 through resistor 20, this causes transistor 5 to be turned Off. Transistor 1, on the other hand, in being turned "On" operates to raise the potential level at the base of transistor 3 since with transistor 1 conducting, and its collector connected to coil 10, the potential level at this point is now governed by a return to positive battery 17 through resistor 18 instead to negative battery 21 through resistor 26. Transistor 5 having been turned "Off" when the input was supplied to transistor 1 now releases current so that transistor 4 or the pullover transistors 6, 6A or 6B may be turned "On." Since the base of transistors 6, 6A and 6B, if switches 12 and 13 are closed, are normally more positive than ground, transistor 4 conducts and the potential level shift in its load circuit operates to hold the base of transistor 3 in the "On" condition. The magnitude and duration of the input pulse applied to either transistors 1 or 6 or those in parallel with it, is not critical since once the latching transistors 3 or 5 have been turned On, the magnitude of the potential excursion is always sufficient to exceed the signal level change at the input of transistors 1 or 6. Diodes 19 and 24 serve to prevent current flow from ground into the emitters of transistors 1 and 4 when their bases are negative. Diodes 27 and 28 serve the function of clamping the collectors of transistors 3 and 5 thereby preventing these collectors from departing from ground potential by a value greater than the forward potential drop across the respective diodes and thereby to hold these transistors out of saturation. This also serves to prevent the collectors of these transistors from reaching a sufficiently high potential to break down the characteristically low emitter to base diodes of the transistors 2, 4, 1, 1A and 1B, 6, 6A and 6B. In the event that transistors, not having these limitations, are used, diodes 27 and 28 may be deleted.

It will be apparent to one skilled in the art, that one of the primary advantages in this type of circuitry is that only one "logical block" delay occurs in the switching operation in that all of the changes in state, of all of the active elements occur simultaneously and that the effect of the input is coupled immediately from the base of the pullover transistor to the output to be sensed. Since transistors 1 and 6 perform only pullover functions, it will be apparent to one skilled in the art, with a bistable circuit of the type of this invention, it is possible to provide as many inputs comprising parallel connected transistors as is desirable.

In order to aid in understanding and practicing the invention, the following table of values and signal levels has been provided, it being understood that the invention is not to be limited thereby, in that a wide range of such values would be apparent to one skilled in the art and further, that the interchangeability of NPN and PNP type transistors may be made with judicious interchanging of potential polarities.

| | |
|---|---|
| Transistors 24, 1, 1A, 1B, 6, 6A, 6B—PNP conductivity type: High-speed transistors of the "Drift" type capable of dissipating 50 milliwatts at maximum ambient temperature, frequency cut off—70 megacycles, emitter to base breakdown voltage | 1 volt. |
| Transistors 3 and 5—NPN conductivity type: High-speed transistors of the "Drift" type capable of dissipating 50 milliwatts at maximum ambient temperature, frequency cut off—70 megacycles, emitter to base breakdown voltage | 1 volt. |
| Diodes 19, 24, 27 and 28 | Transitron T14G or equivalent. |
| Resistors 18 and 22 | 8,000 ohms. |
| Resistor 20 | 2,400 ohms. |
| Resistors 8 and 11 | 220 ohms each. |
| Resistors 25 and 26 | 7,500 ohms each. |
| Inductances 7 and 10 | 2.7 microhenries each. |
| Battery 7 | +18 volts. |
| Battery 21 | −24 volts. |
| Battery 9 | −6 volts. |
| Switches 12, 13 14 and 15 | Single pole, single throw. |
| Input signal level swing | −0.6 volt to +0.6 volt duration not critical so long as longer than switching time. |
| Output signal swing | −6.6 volts to −5.4 volts. |

The bistable circuit of this invention constructed under the above specification operates in the vicinity of 10 megacycle pulse repetition rate with delays from input to either output approximately equal and averaging approximately 15 millimicroseconds.

What has been described is a transistor bistable circuit wherein two cross-coupled active grounded base switching stages are interconnected with latching and pullover elements so that the saturation resistance and the emitter to base breakdown voltage characteristic of megacycle frequency range high-speed components which are employed are compensated for in the circuit and all the switching and latching occurs simultaneously with only one logical block delay. Through the use of pullover inputs, the circuit immediately responds to the input signal and as great a plurality of inputs as is desired may be connected in parallel with no appreciable decrease in switching rate.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. A bistable transistor circuit comprising first and second switching stages, each stage including a constant current source supplying constant current to a given point in each said first and said second stage, a first current path from said point in each said stage through a grounded base transistor having its emitter connected to said point and each transistor having two parallel load branches connected to the collector thereof, corresponding pairs of said load branches being returned to a like polarity terminal of a different power source, the potential level of one power source being greater than the other, means returning the remaining terminal of each said power source to ground, a second current branch path in each stage comprising a transistor of opposite conductivity type to said grounded base transistor and having its collector connected to said point, said transistors in said second path having a common emitter load impedance and being returned to said like polarity terminal of said greater potential source, means coupling the base of the second current path transistor of said first stage to the load branch of the first current path of said second stage that is returned to the lesser of said different power sources and means coupling the base of said second current path of said second stage to the load branch of the first current path of said first stage that is returned to the lesser of said different power sources and at least one means for removing the emitter current supply of each of said first current branches of said first and said second stages in response to input signals.

2. The bistable circuit of claim 1 wherein said first current paths in said first and said second stages include PNP type transistors and said second current paths in said first and said second stages include NPN type transistors.

3. The bistable circuit of claim 1 wherein said first and second current paths of each stage are NPN and PNP types of transistors, respectively.

4. The bistable circuit of claim 1 wherein said at least one means for removing the emitter current supply of each of said first current branches comprises at least two transistors having the emitter thereof directly connected to the emitter of said grounded base transistor of said branch and the collectors thereof directly connected to the collector of said grounded base transistor of the opposite branch.

5. A bistable transistor circuit comprising, in combination, first and second sources of constant current supplied to first and second common points, first and second grounded base transistor current paths having the emitter thereof connected to each said first and said second common points and having the collectors thereof each returned through a respective first load impedance path to a first polarity first terminal of a first source of power having the opposite polarity terminal thereof grounded, first and second latching transistor circuit stages, each comprising a transistor of a conductivity type opposite to that of the transistor of said first and second grounded base current paths and each having the collector thereof connected to said common point, means connecting the emitters of said latching circuit stages together, a common load impedance connected between the emitters of said latching circuit stages and said first polarity terminal of said first source of power, first and second parallel collector current paths, each comprising at least first and second series connected impedance elements respectively connected between the collectors of said first and said second grounded base transistors and a first polarity first terminal of a second source of power having the opposite polarity terminal thereof grounded, the potentials of said second source of power being of lesser magnitude than said first source of power, means coupling potential excursions appearing at the collector of said first grounded base transistor to the base of said second latching transistor, means coupling potential excursions at the collector of said second grounded base transistor to the base of said first latching transistor, first and second pullover type transistor active elements having the emitters thereof connected to each said first and said second common point and the collectors thereof connected to the collectors of each said first and said second grounded base transistors and signal input means connected to the base of each said pullover transistor.

6. The bistable circuit of claim 5 wherein said first and said second active grounded base transistor stages comprise PNP type transistors.

7. The bistable circuit of claim 5 wherein said first and said second grounded base active transistor stages comprise NPN type transistors.

8. The transistor bistable circuit comprising, in combination, a first source of power having a negative terminal thereof connected to reference potential, a first resistor having a first terminal thereof connected to the positive terminal of said first source of power, a first transistor having the base thereof connected to ground and having the emitter thereof connected to the remaining terminal of said first resistor, a second resistor having one terminal thereof connected to the collector of said first transistor, a second source of power having a negative terminal thereof connected to the remaining terminal of said second resistor and having the positive terminal thereof connected to reference potential, a third resistor having one terminal thereof connected to the positive terminal of said first power source, a second transistor having the emitter thereof connected to the remaining terminal of said third resistor, the base of said second transistor being connected to ground, a fourth resistor having the first terminal thereof connected to the collector of said second transistor and having the remaining terminal thereof connected to the negative terminal of said second power source, a third source of power having a magnitude lesser than said second source of power and having the positive terminal thereof connected to ground, a first inductance having one terminal thereof connected to the collector of said first transistor, a fifth resistor having a first terminal thereof connected to the remaining terminal of said first inductor having the remaining terminal thereof connected to the negative terminal of said third source of power, a second inductor having one terminal thereof connected to the collector of said second transistor, a sixth resistor having a first terminal thereof connected to the remaining terminal of said second inductor and having the remaining terminal thereof connected to the negative terminal of said third power source, a third transistor having a conductivity type opposite to that of said first and said second transistors, means coupling the base of said third transistor to said second terminal of said second inductance, a first asymmetric impedance means coupling the collector of said third transistor to the anode of said first asymmetric impedance, means coupling the cathode of said first asymmetric impedance to the emitter of said first transistor, a second asymmetric impedance means coupling the collector of said third transistor to the anode of said second asymmetric impedance and means coupling the cathode of said second asymmetric impedance to reference potential, a seventh impedance having one terminal thereof connected to the negative terminal of said second source of potential, means coupling the emitter of said third transistor to the remaining terminal of said seventh impedance, a fourth transistor having a conductivity type opposite to said first and said second transistor means coupling the base of said fourth transistor to said second terminal of said first inductor, a third asymmetric impedance means coupling the collector of said fourth transistor to the anode of said third asymmetric impedance and means coupling the cathode of said third asymmetric impedance to the emitter of said second transistor, a fourth asymmetric impedance means coupling the collector of said fourth transistor to the anode of said fourth asymmetric impedance and means coupling the cathode of said fourth asymmetric impedance to reference potential, means coupling the emitter of said fourth transistor to the emitter of said third transistor, a fifth transistor having the emitter thereof connected to the emitter of said first transistor and having the collector of said second transistor and a sixth transistor having the emitter thereof connected to the emitter of said second transistor and having the collector thereof connected to the collector of said first transistor.

9. The circuit of claim 8 wherein said first and said second transistors are of the PNP type and said third and said fourth transistors are of the NPN type.

10. The bistable circuit of claim 8 wherein said first and said second transistors are of the NPN type and said third and said fourth transistors are of the PNP type.

No references cited.